United States Patent [19]
Fujita et al.

[11] Patent Number: 5,268,864
[45] Date of Patent: Dec. 7, 1993

[54] PROGRAMMABLE MEMORY DEVICE HAVING PROGRAMMING CURRENT ABSORBING TRANSISTORS

[75] Inventors: Yoshiyuki Fujita, Kawasaki; Kouji Ueno, Inagi; Yuji Tsuchimoto, Hiroshima, all of Japan

[73] Assignee: Fujitsu Limited, Kawasaki, Japan

[21] Appl. No.: 751,107

[22] Filed: Aug. 28, 1991

[30] Foreign Application Priority Data

Aug. 31, 1990 [JP] Japan .................................. 2-231515

[51] Int. Cl.⁵ ............................................ G11C 11/30
[52] U.S. Cl. ........................ 365/189.01; 365/189.05; 365/230.08
[58] Field of Search ............... 365/203, 189.01, 230.01, 365/189.05, 230.06, 230.08

[56] References Cited

U.S. PATENT DOCUMENTS 4,953,127  8/1990  Nagahashi et al. ................. 365/226

OTHER PUBLICATIONS

Patent Abstracts of Japan, vol. 14, No. 183 (P-1035) Apr. 12, 1990 & JP-A-029998 (NEC Corp) Jan. 31, 1990.

Patent Abstracts of Japan, vol. 14, No. 321 (P-1074) Jul. 10, 1990 & JP-A-2 105395 (NEC Corp) Apr. 7, 1990.

*Primary Examiner*—Terrell W. Fears
*Attorney, Agent, or Firm*—Staas & Halsey

[57] ABSTRACT

A programmable memory device includes memory cells arranged at cross points of word lines and bit lines, a selecting part for selectively decreasing potentials of the word lines, and a writing part for selectively supplying programming currents to the memory cells via the bit lines. Programming current absorbing transistors have first terminals respectively connected to the word lines, second terminals set at a predetermined potential, and bases, and a common load element connected between a node and a programming voltage line. A plurality of base current supplying circuits, which are respectively coupled to the programming current absorbing transistors and connected in common to the node, turn ON the programming current absorbing transistors related to word lines selected by the selecting part so that base currents pass from the programming voltage line to the bases of the programming current absorbing transistors via the common load element and the base current supplying circuits.

17 Claims, 12 Drawing Sheets

TO NODE A

FIG.9B

TO NODE A

FIG.9C

TO NODE A

ID=5,268,864

PROGRAMMABLE MEMORY DEVICE HAVING PROGRAMMING CURRENT ABSORBING TRANSISTORS

BACKGROUND OF THE INVENTION (1) Field of the Invention

The present invention generally relates to semiconductor memory devices, and more particularly to a programmable read only memory (PROM) of, for example, a fuse type or a PN junction shortcircuiting type.

(2) Description of the Related Art

A fuse type PROM has a fuse which is melted by allowing a large current to pass through the fuse in order to write data into a selected memory cell. A PN junction shortcircuiting type of PROM has a PN junction which is broken by allowing a large current to pass through the PN junction, so that data is written into a selected memory cell. In either type of PROM, it is possible to write data once in the memory cell.

Figure 1A:
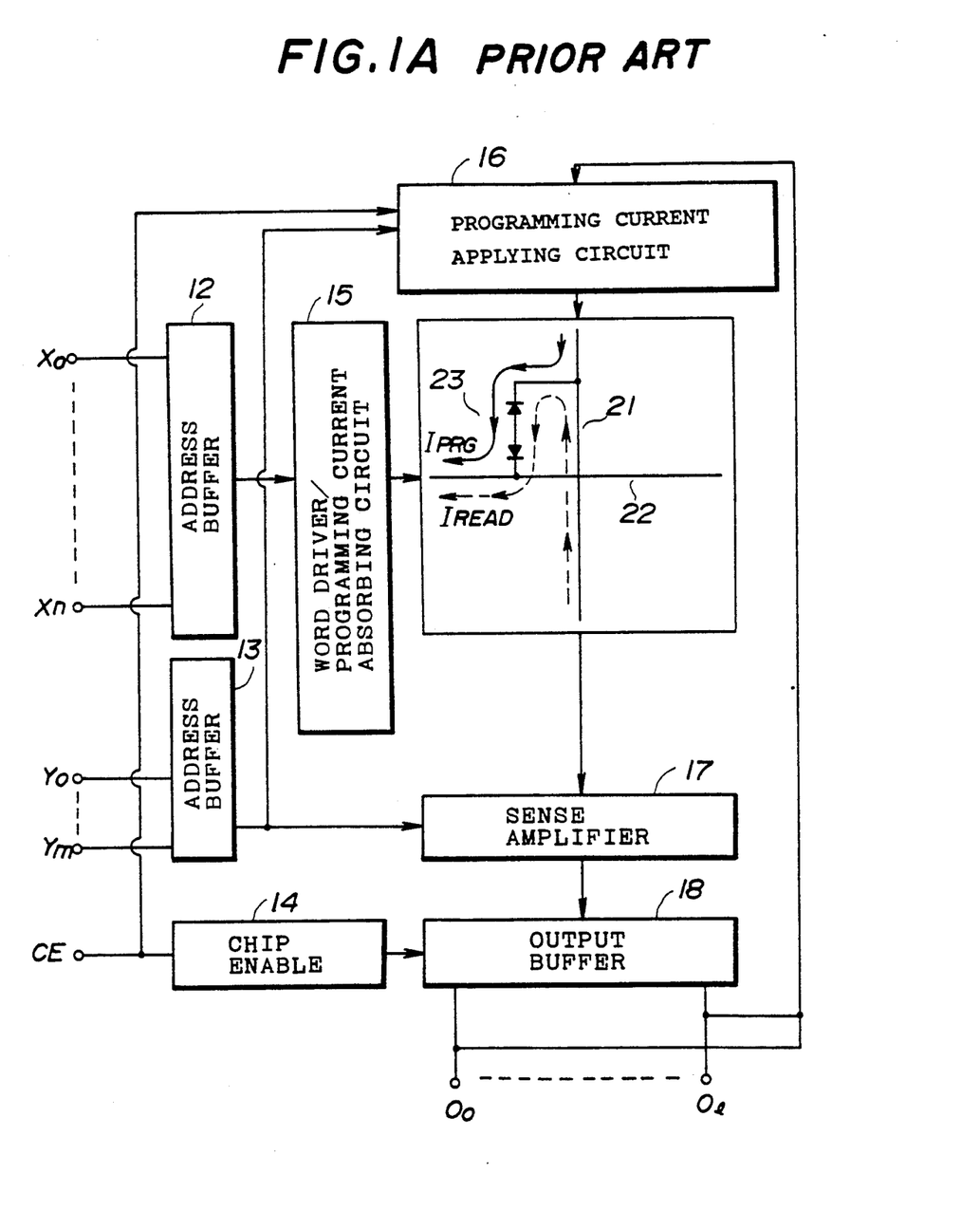
FIGS. 1A and 1B are diagrams of a conventional PROM.

FIG. 1A is a block diagram of a such conventional PROM. The PROM in FIG. 1A is made up of a memory cell array 11, an address buffer 12, an address buffer 13, a chip enable circuit 14, a word driver/programming current absorbing circuit 15, a programming current applying circuit 16, a sense amplifier 17 and an output buffer 18. A row address signal comprising of address bits X0–Xn is buffered in the address buffer 12 and then applied to the word driver/programming current absorbing circuit 15. A column address composed of address bits Y0–Yn is buffered in the address buffer 13, and applied to the programming current applying circuit 16 and the sense amplifier 17. A chip enable signal CE is input to the chip enable circuit 14 and the programming current applying circuit 16. The chip enable circuit 14 activates the output buffer circuit 18 in response to the chip enable signal CE. The programming current applying circuit 16 applies a programming current to at least one bit line 21 on the basis of the column address read out from the address buffer 13 as well as readout data $D_0$–$D_1$ obtained on the output side of the output buffer 18. The word driver/programming current absorbing circuit 15 selects at least one word line 22. When data is written into a memory cell 23, a programming current $I_{PRG}$ is allowed to pass through the memory cell 23, as shown by the solid line shown in FIG. 1A. Meanwhile, when data is read out from the memory cell 23, a read current $I_{READ}$ passes through the memory cell 23, as shown by the broken line shown in FIG. 1A.

Figure 1B:
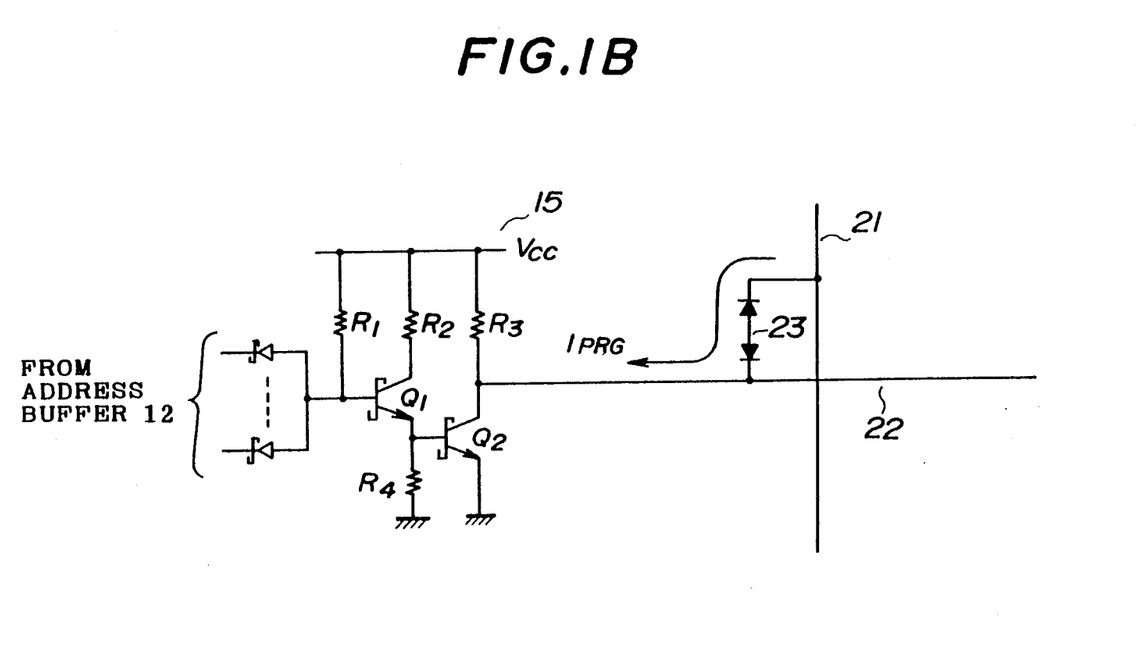

FIG. 1B is a circuit diagram of the word driver/programming current absorbing circuit 15. The circuit configuration shown in FIG. 1B is provided for each of the word lines 22. The circuit in FIG. 1B comprises two Schottky transistors Q1 and Q2 and four resistors R1–R4. The resistors R1–R3 are connected to a power supply line maintained at a power supply voltage Vcc. When data is written into the memory cell 23, the transistors Q1 and Q2 are turned ON, and the programming current $I_{PRG}$ passes through the bit line 21, the memory cell 23, the word line 22 and the transistor Q2. In order to write data into the memory cell 23 at a high speed, the transistors Q1 and Q2, particularly transistor Q2, must have a large area (a large mutual conductance).

Figure 2A:
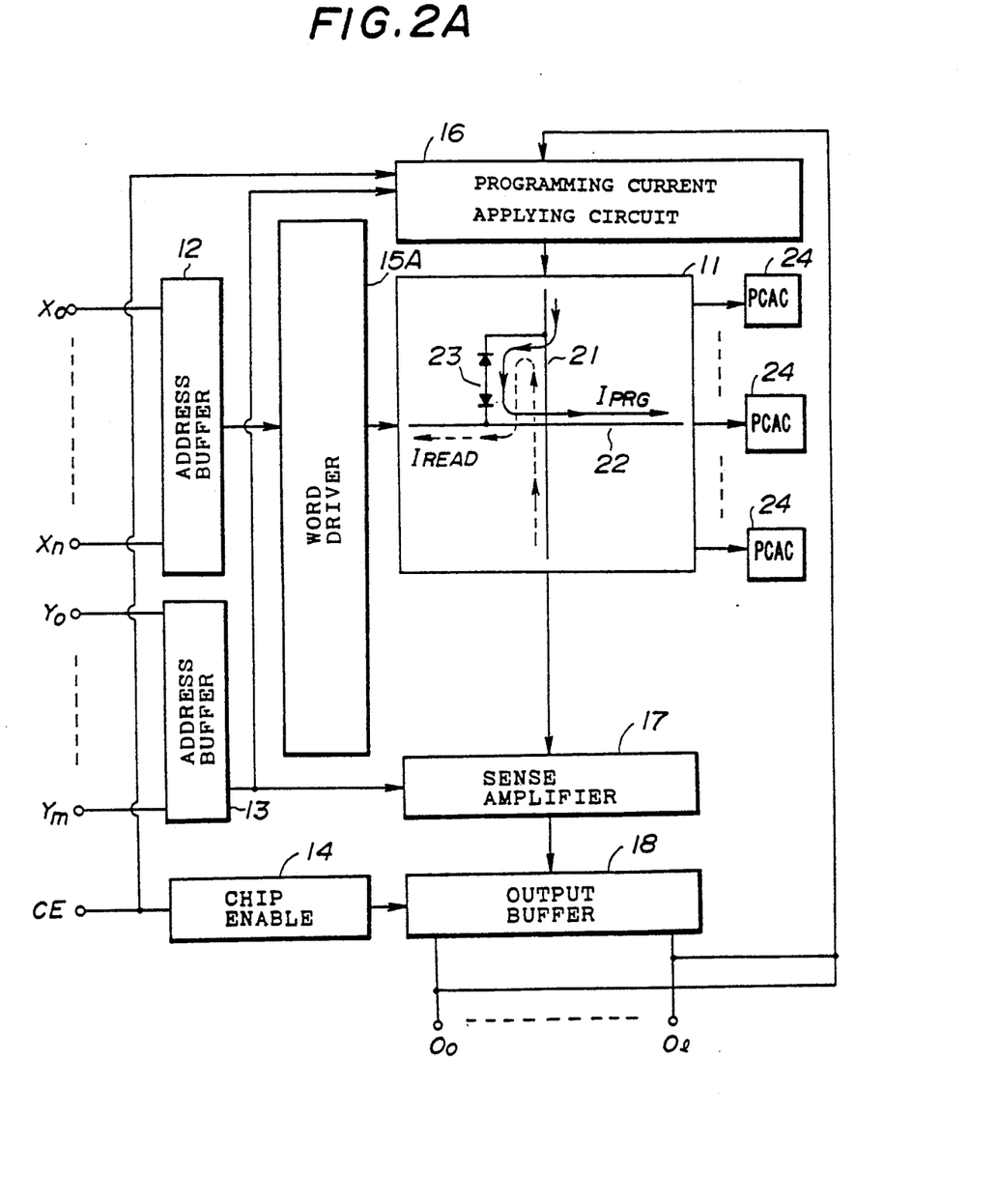
FIGS. 2A, 2B and 2C are diagrams of an improved PROM.
Figure 2B:
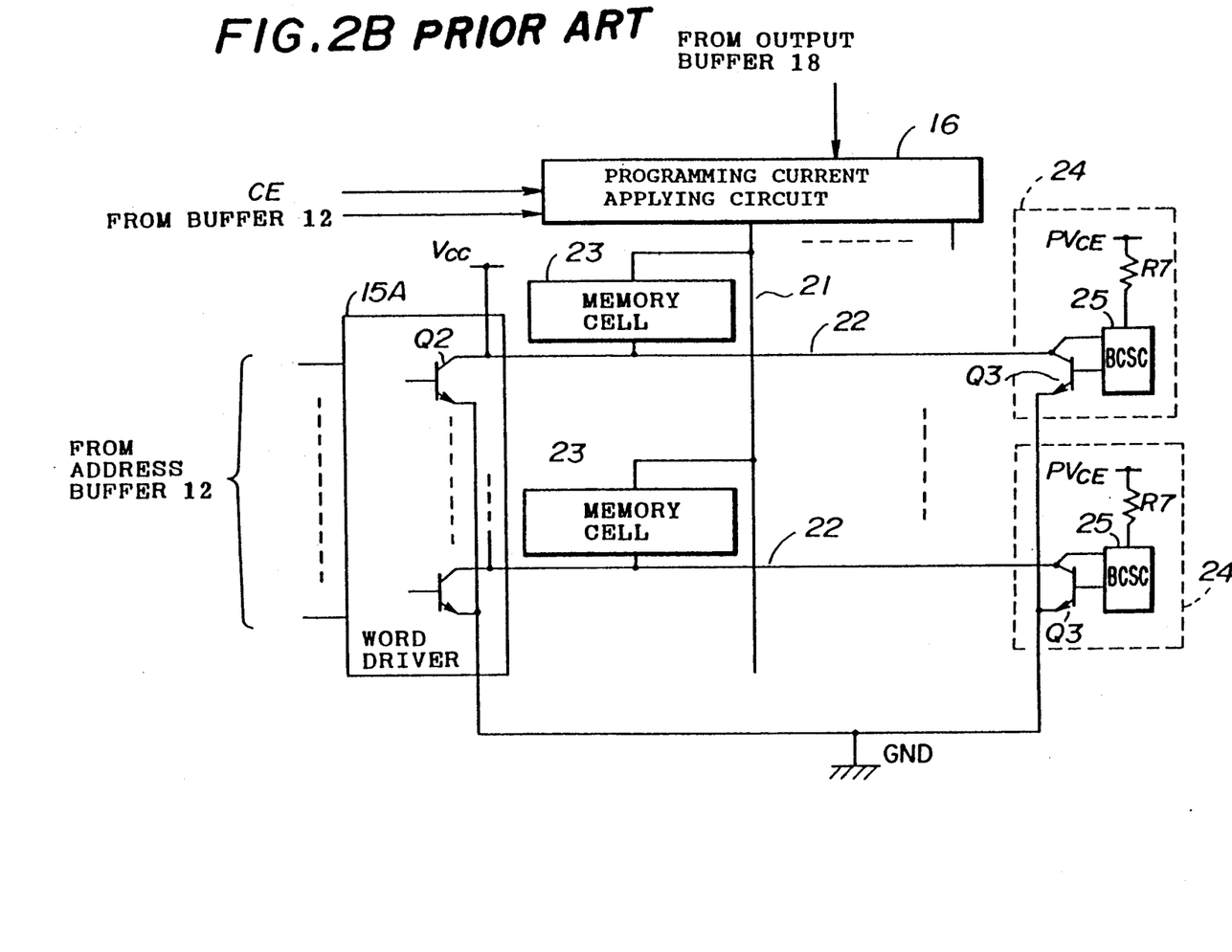

In order to reduce the sizes of the transistors Q1 and Q2, as shown in FIG. 2A, it is possible to provide each word line 22 with a programming current absorbing circuit (PCAC) 24 separately from a word driver 15A having the same configuration as that of the circuit 15 except for the transistor size. Each programming current absorbing circuit 24 as shown in FIG. 2B, comprises a transistor Q3, a base current supply circuit BCSC 25, and a load resistor R7. The collector of the transistor Q3 is connected to the corresponding word line 22, and the base thereof is supplied with a base current generated by the base current supply circuit 25, which is connected to a power source line which is maintained at a programming voltage $PV_{CE}$ for use in data writing. The emitters of the transistors Q3 are maintained at a predetermined potential $V_A$ equal to, for example, ground potential GND. The collector of the transistors Q3 are coupled to the resistors R7 via the base current supply circuits 25. The transistors Q3 are of a size larger than that of the transistors Q2. When the memory cell 23 is programmed, most of the programming current $I_{PRG}$ passes through the bit line 21, the memory cell 23, the word line 22 and the transistor Q3. Thus, it is possible to prevent a large current from passing through the transistor Q2.

Figure 2C:
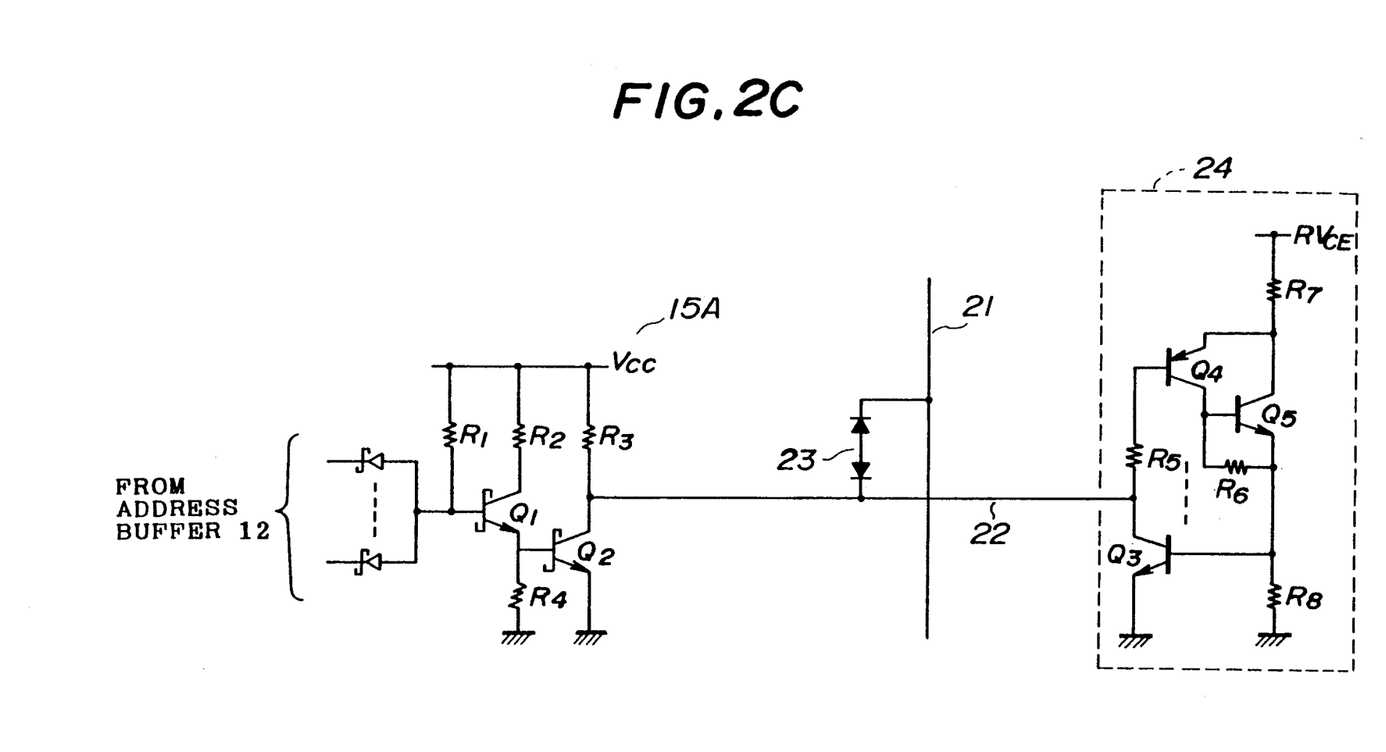

As shown in FIG. 2C, the base current supply circuit 25 comprises of transistors Q4 and Q5, and resistors R5–R8. The sizes of the transistors Q4 and Q5 are smaller than the size of the transistor Q3. The NPN type transistor Q4 and the PNP type transistor Q5 form an SCR (Silicon Controlled Rectifier).

However, the circuit configuration shown in FIGS. 2A through 2C has the following disadvantage. Each word line 22 which is not selected, is maintained at a high potential approximately equal to Vcc, so that the transistor Q4 is OFF and thus the transistors Q3 and Q5 are also OFF. However, if an instantaneous noise signal occurs in one or a plurality of the word lines 21 which are not being selected while one of the word lines 21 is being selected, and the potential(s) of the word line(s) 21 slightly decreases temporarily, the transistor Q4 may be turned ON, and thus the transistors Q5 and Q3 are turned ON. As a result, the corresponding word line(s) is (are) turned ON, and data is erroneously written into the corresponding memory cell(s) 23. Thus, the word lines 21 do not have sufficient potential margins.

SUMMARY OF THE INVENTION

It is a general object of the present invention to provide a semiconductor memory device in which the above-mentioned disadvantage is eliminated.

A more specific object of the present invention is to provide a semiconductor memory device capable of definitely writing data into only a selected memory cell, so that erroneous programming is prevented.

The above-mentioned objects of the present invention are achieved by a programmable memory device comprising: memory cells arranged at cross points of word lines and bit lines; select means, coupled to the word lines, for selectively decreasing potentials of the word lines; write means, coupled to the bit lines, for selectively supplying programming currents to the memory cells via the bit lines; programming current absorbing transistors having first terminals respectively connected to the word lines, second terminals set at a predetermined potential, and bases; a common load element connected between a node and a programming voltage line; and a plurality of base current supplying means, respectively coupled to the programming current absorbing transistors and connected in common to the node, for turning ON the programming current absorbing transistors related to word lines selected by the select means so that base currents pass from the programming voltage line to the bases of the programming current absorbing transistors via the common load element and the base current supplying means.

The above-mentioned objects of the present invention are also achieved by a programmable memory device comprising: memory cells arranged at cross points of word lines and bit lines; select means, coupled to the word lines, for selectively decreasing potentials of the word lines, the word lines being grouped into a plurality of groups; write means, coupled to the bit lines, for selectively supplying programming currents to the memory cells via the bit lines; programming current absorbing transistors having first terminals respectively connected to the word lines, second terminals set at a predetermined potential, and bases; a plurality of common load elements respectively provided with respect to the groups and connected between a programming voltage line and respective nodes; and a plurality of base current supplying means, respectively coupled to the programming current absorbing transistors and connected in common to the respective nodes, for turning ON the programming current absorbing transistors related to word lines selected by the select means so that base currents pass from the programming voltage line to the bases of the programming current absorbing transistors via the common load element and the base current supplying means.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 3:
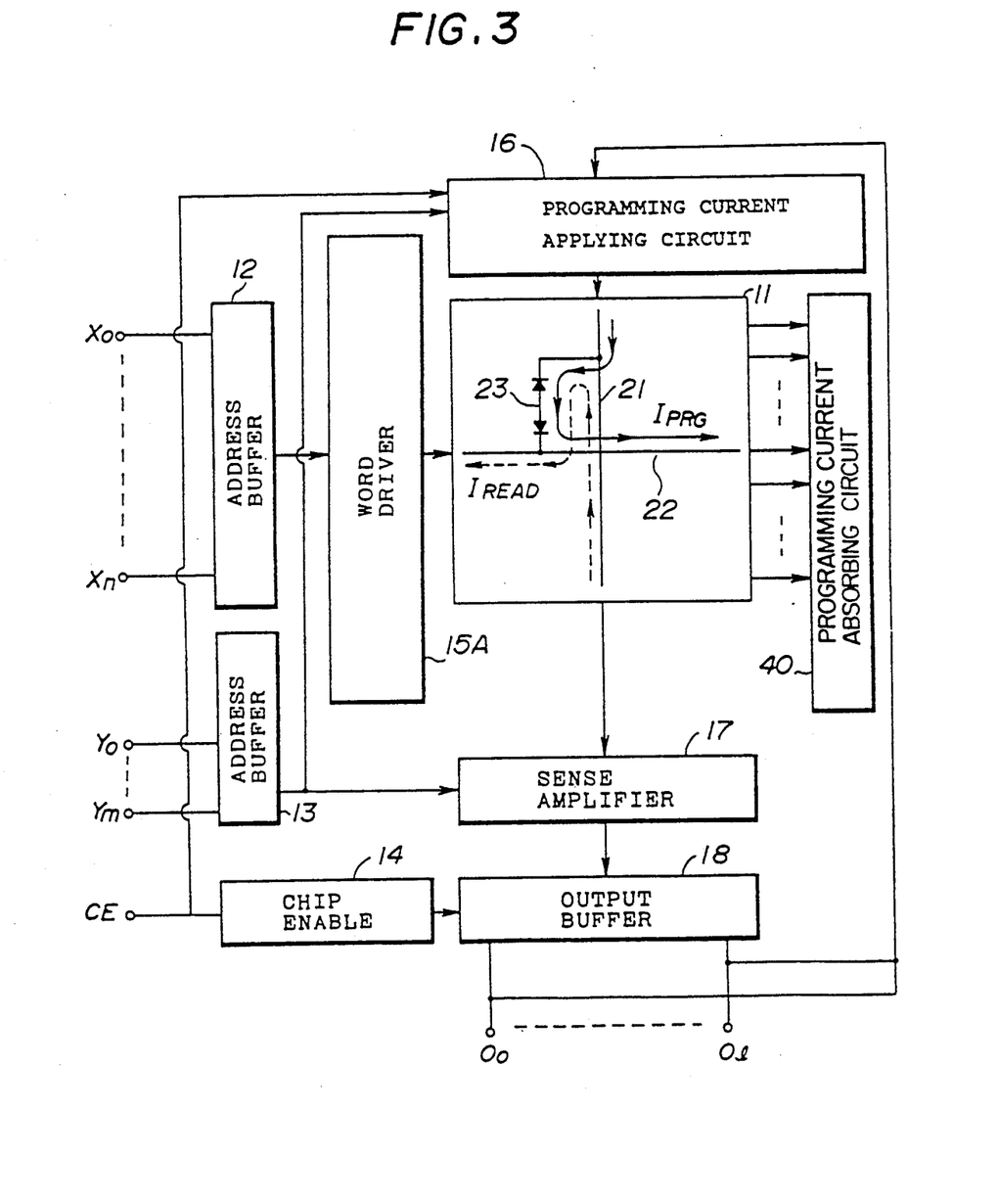
FIG. 3 is a block diagram of a first preferred embodiment of the present invention.

A description will now be given of a PROM according to a first preferred embodiment of the present invention with reference to FIG. 3, in which those parts which are the same as those shown in the previously described figures are given the same reference numerals. A programming current absorbing circuit 40 is substituted for the aforementioned programming current absorbing circuits 24 shown in FIGS. 2A through 2C.

Figure 4:
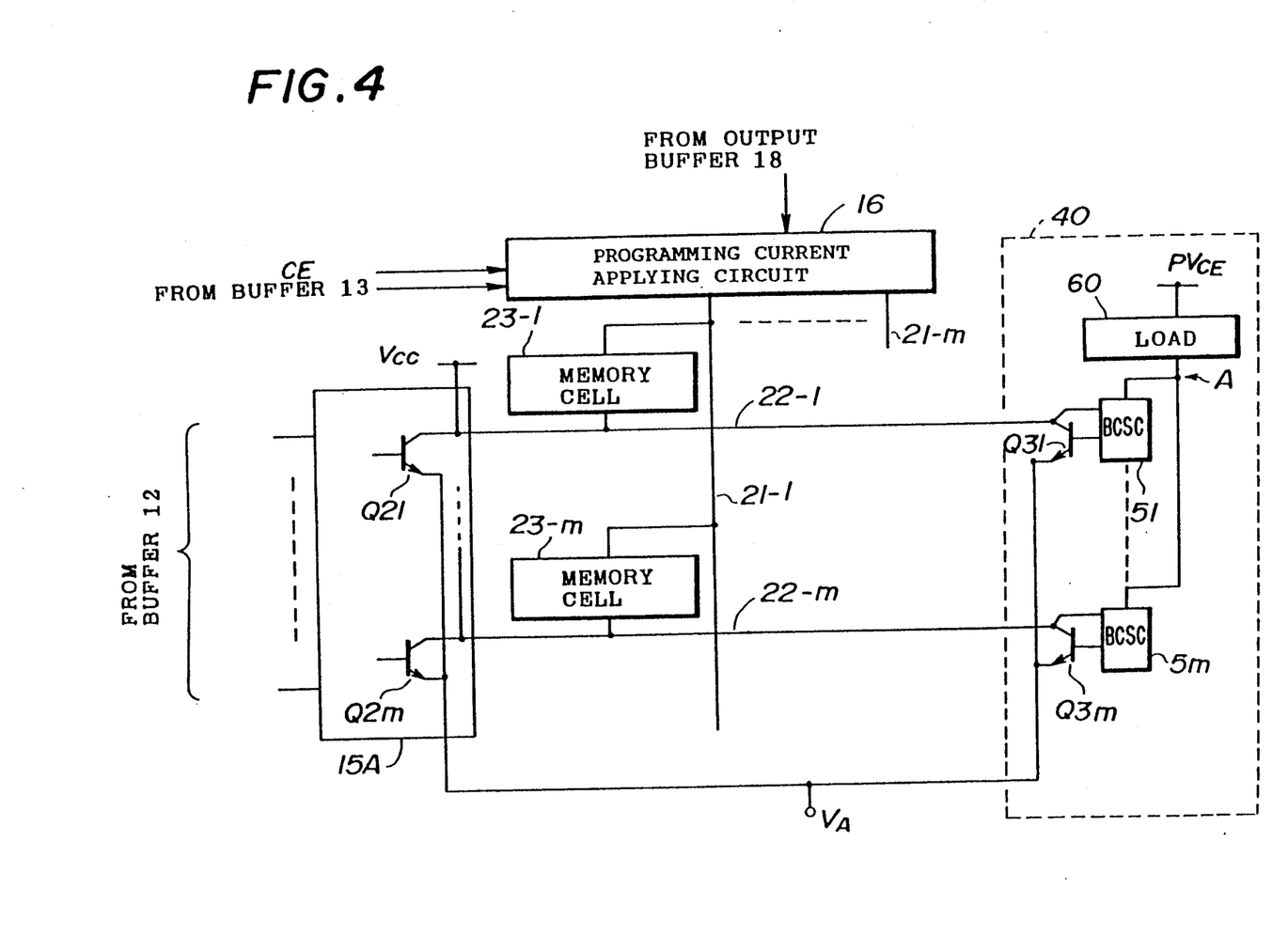
FIG. 4 is a block diagram of the circuit configuration shown in FIG. 3 in more detail.

Referring to FIG. 4, memory cells 23-1 through 23-m are connected to a common bit line 21-1, and are connected to the word lines 22-1 through 22-m, respectively. In the configuration in FIG. 4, m×n memory cells are provided at corresponding cross points of bit lines 21-1 through 21-m and word lines 22-1 through 22-m. Each memory cell is, for example, a fuse type or PN junction shortcircuiting memory cell. The programming current absorbing circuit 40 prevents large programming currents from passing through transistors Q21 through Q2m of the word driver 15A.

The programming current absorbing circuit 40 comprises of NPN transistors Q31–Q3m, base current supply circuits 51–5m, and a common load element 60. It should be noted that the common load element 60 is connected in common to the base current supply circuits 51–5m. The collectors of the transistors Q31–Q3m are connected to word lines 22-1–22-m, respectively. The emitters of the transistors Q31–Q3m are maintained at the predetermined potential $V_A$ lower than Vcc and $PV_{CE}$, and the bases thereof are connected to the respective base current supply circuits 51–5m. The programming voltage $PV_{CE}$ is applied, via the common load element 60, to the base current supply circuits 51–5m. The collectors of the transistors Q31–Q3m are coupled, via circuit elements of the circuits 51–5m, to a node A which one end of the common load element 60 is commonly connected to the base current supply circuits 51–5m. For example, when the word line 22-1 is selected, the potential thereof becomes equal to the predetermined potential $V_A$. Thereby, the base current supply circuit 51 related to the selected word line 22-1 is turned ON, and the transistor Q31 is turned ON. Thus, most of the programming current passes through the bit line 21-1, the memory cell 23-1, the word line 22-1 and the transistor Q31. During the above programming operation, the potential of the node A is much lower than the programming voltage $PV_{CE}$. If an instantaneous noise takes place in, for example, the word line 22-m (which is not being selected) and the potential thereof decreases temporarily, the base current supply circuit 5m will not be turned ON because the potential of the node A is much lower than the programming voltage $PV_{CE}$ and thus is insufficient to turn ON the base current supply circuit 5m.

Figure 5A:
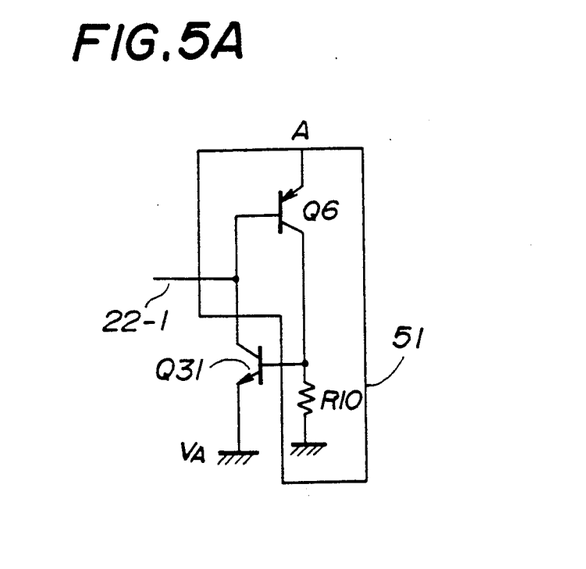
FIGS. 5A and 5B are respectively circuit diagrams of programming current absorbing circuits shown in FIGS. 3 and 4.

FIG. 5A shows a first circuit configuration of the base current supply circuit 51. Each of the other base current supply circuits 52–5m has the same circuit configuration as the base current supply circuit 51. As shown in FIG. 5A, the base current supply circuit 51 is composed of a PNP transistor Q6 and a resistor R10. The emitter of the transistor Q6 is connected to the node A, and the base thereof is connected to the collector of the transistor Q31. The collector of the transistor Q6 is connected to the base of the transistor Q31 and one end of the resistor R10, the other end of which is grounded.

Figure 5B:
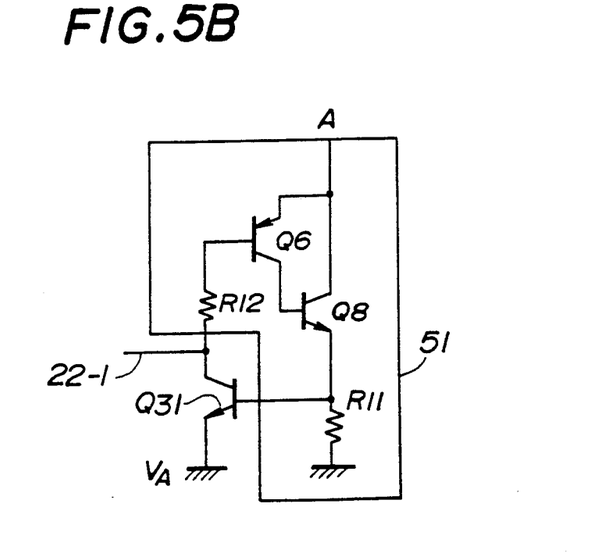

FIG. 5B shows a second circuit configuration of the base current supply circuit designated 51. Each of the other base current supply circuits 52–5m has the circuit configuration shown in FIG. 5B. As shown in FIG. 5B, the base current supply circuit 51 is composed of a PNP transistor Q6 and an NPN transistor Q8, together forming a Darlington pair, and resistors R11 and R12. The emitter of the transistor Q6 and the collector of the transistor Q8 are connected to the node A. The base of the transistor Q6 is coupled to the collector of the transistor Q31 via the resistor R12. The collector of the transistor Q6 is connected to the base of the transistor Q8. The emitter of the transistor Q8 is connected to the base of the transistor Q31 and one end of the resistor R11. The other end of the resistor R11 is grounded.

Figure 6A:
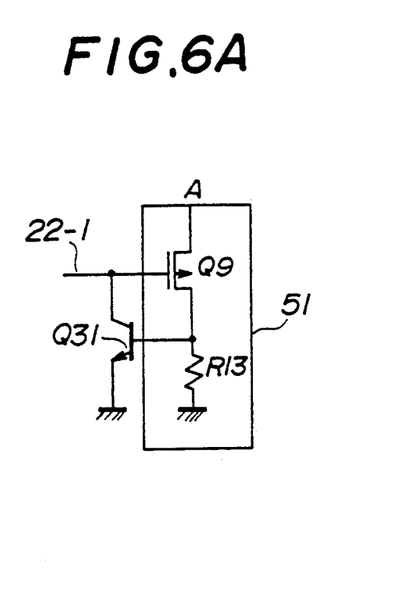
FIGS. 6A, 6B, 6C and 6D are respectively circuit diagrams of the programming current absorbing circuits shown in FIGS. 3 and 4.

FIG. 6A shows a third circuit configuration of the base current supply circuit 51. Each of the other base current supply circuits 52–5m has the circuit configuration shown in FIG. 6A. As shown in FIG. 6A, the third circuit configuration of the base current supply circuit 51 includes a P-channel field effect transistor Q9, and a resistor R13. The source of the transistor Q9 is connected to the node A, and the drain thereof is connected to the base of the transistor Q31 and one end of the resistor R13. The other end of the resistor R13 is grounded. The gate of the transistor Q9 is connected to the collector of the transistor Q31.

Figure 6B:
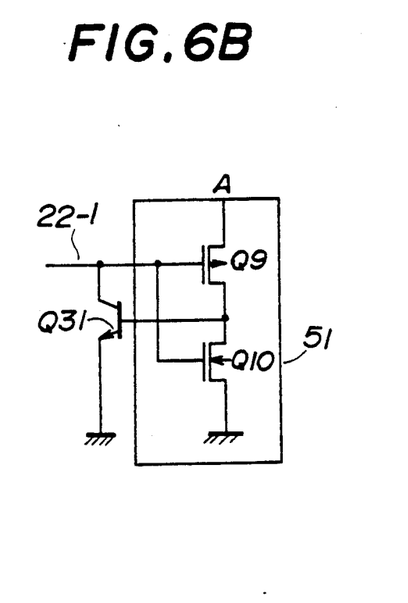

FIG. 6B shows a fourth circuit configuration of the base current supply circuit 51. Each of the other base current supply circuits 52–5m has the same circuit configuration as the circuit 51. As shown in FIG. 6B, the fourth circuit configuration includes an N-channel field effect transistor Q10 in addition to the P-channel field effect transistor Q9. The transistor Q10 functions as the resistor R13 shown in FIG. 6A. The drain of the transistor Q9 is connected to the drain of the transistor Q10, and the source of the transistor Q10 is grounded. The gate of the transistor Q10 is connected to the collector of the transistor Q31.

Figure 6C:
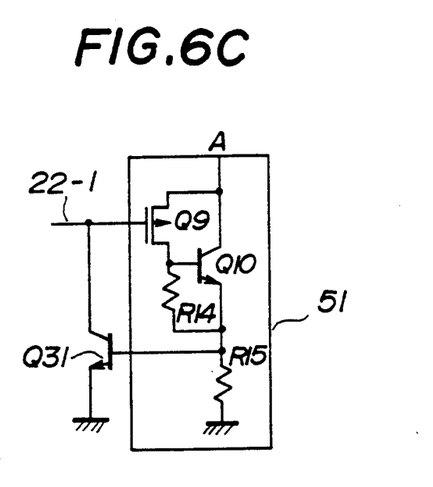

FIG. 6C shows a fifth circuit configuration of the base current supply circuit 51. Each of the other base current supply circuits 52–5m has the same circuit configuration as the circuit 51. As shown in FIG. 6C, the fifth circuit configuration is composed of transistor Q9, an NPN transistor Q10, and two resistors R14 and R15. The collector of the transistor Q10 is connected to the source of the transistor Q9. The base of the transistor Q10 is connected to the drain of the transistor Q9. The resistor R14 is connected between the base and emitter of the transistor Q10. The emitter of the transistor Q10 is connected to the base of the transistor Q31 and one end of the resistor R15. The other end of the resistor R15 is grounded. The resistors R14 and R15 are load elements of the transistor Q9.

Figure 6D:
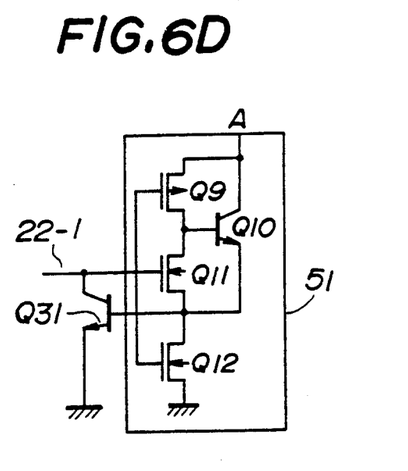

FIG. 6D shows a sixth circuit configuration of the base current supply circuit 51. Each of the other base current supply circuits 52–5m has the same circuit configuration as the circuit 51. As shown in FIG. 6D, the sixth circuit configuration includes four transistors Q9, Q10, Q11 and Q12. The transistors Q11 and Q12, which are N-channel field effect transistors, function as the resistors R14 and R15 shown in FIG. 6C, respectively. The drain of the transistor Q11 is connected to the base of the transistor Q10, and the gate of the transistor Q11 is connected to the collector of the transistor Q31. The source of the transistor Q11 is connected to the base of the transistor Q31, the drain of the transistor Q12 and the emitter of the transistor Q10. The gate of the transistor Q12 is connected to the gate of the transistor Q9, and the source of the transistor Q12 is grounded.

A description will now be given of the operation of the first preferred embodiment of the present invention. During a write (programming) operation, the word driver 15A (FIG. 3) receives the address signal from the address buffer 12, and turns ON at least one of the transistors Q21 through Q2m (FIG. 4). At this time, it is possible to start to apply the programming voltage $PV_{CE}$ generated by an external device to the PROM. Assuming now that the selected word line is the word line 22-1, the potential of the word line 22-1 decreases to the potential $V_A$, while the programming voltage $PV_{CE}$ is applied to the base current supply circuits 51–5m via the common resistor 60.

In the case where each of the base current supply circuits 51–5m has the circuit configuration shown in FIG. 5A, the transistor Q6 of the base current supply circuit 51 related to the selected word line 22-1 is turned ON. The collector current of the transistor Q6 passes through the resistor R10 and is supplied to the base of the transistor Q31, so that the transistor Q31 is turned ON. Thus, the word line 22-1 is set to the potential $V_A$ via the transistors Q31 and the transistor Q21. In the case where each of the base current supply circuits 51–5m has the circuit configuration shown in FIG. 5B, the transistor Q6 is turned ON in response to the decrease in the potential of the word line 22-1. The collector current of the transistor Q6 passes through the transistor Q8 and the resistor R11, and is applied to the base of the transistor Q31. Thereby, the transistor Q31 is turned ON, so that the selected word line 22-1 is set to the potential $V_A$ via the transistors Q21 and Q31.

In the case where each of the base current supply circuits 51–5m has any of the circuit configurations shown in FIGS. 6A through 6D, the transistor Q31 is turned ON in response to the decrease in the potential of the selected word line 22-1.

Then, the programming current applying circuit 16 outputs the programming current to at least one of the bit lines 21-1 through 21-m. Assuming that the programming current applying circuit 16 supplies the programming current to the bit line 21-1, the programming current passes through the memory cell 23-1 and is applied to the selected word line 22-1. Since the transistor Q31 has a size larger than that of the transistor Q21 and thus an ON resistance much lower than that of the transistor Q21, most of the programming current passes through the transistor Q31, and a very small amount of the programming current passes through the transistor Q21. When the programming (write) operation is completed, the transistor Q21 is turned OFF. At this time, the programming voltage $PV_{CE}$ supplied from the external device is turned OFF. The potential of the word line 22-1 starts to increase, and then the transistor Q31 is turned OFF.

If an instantaneous noise occurs in, for example, the word line 22-m and the potential thereof decreases during the above-mentioned programming operation in which the word line 22-1 is selected, the node A is fixed at a potential lower than the programming voltage $PV_{CE}$, and equal to, for example, 0.9 V. Thus, the transistor Q6 shown in FIG. 5A is not turned ON when the word line 22-m decreases to a potential level which is insufficient to turn ON the transistor Q6. When the node A is fixed at 0.9 V and the base-emitter voltage of the transistor Q6 is 0.8 V, the transistor Q6 is not turned ON until the word line 22-m decreases to a potential equal to or lower than 0.1 V.

In the circuit configuration shown in FIG. 5B, the node A is fixed at, for example, 1.7 V since the transistor Q8 is added to the circuit configuration shown in FIG. 5A. Thus, the transistor Q6 related to the non-selected word line 22-m is not turned ON until it decreases to a potential equal to or lower than 0.9 V.

In any of the circuit configurations shown in FIGS. 6A through 6D, the transistors Q9 are not turned ON when the non-selected word line instantaneously decreases due to the occurrence of a noise.

During the read operation, the first embodiment of the present invention operates as follows. The word driver 15A (FIG. 3) selects at least one of the word lines 22-1 through 22-m in accordance with the row address signal from the address buffer 12, and the sense amplifier 17 selects at least one of the bit lines 21-1 through 21-m in accordance with the column address signal from the address buffer 13. During the read operation, the programming voltage $PV_{CE}$ is not applied to the common load element 60. A read current generated by the sense amplifier 17 is applied to the selected memory cell, and data stored therein is read out therefrom. The readout data is sensed and amplified by the sense amplifier 17, and output to an external device via the output buffer 18.

Figure 7:
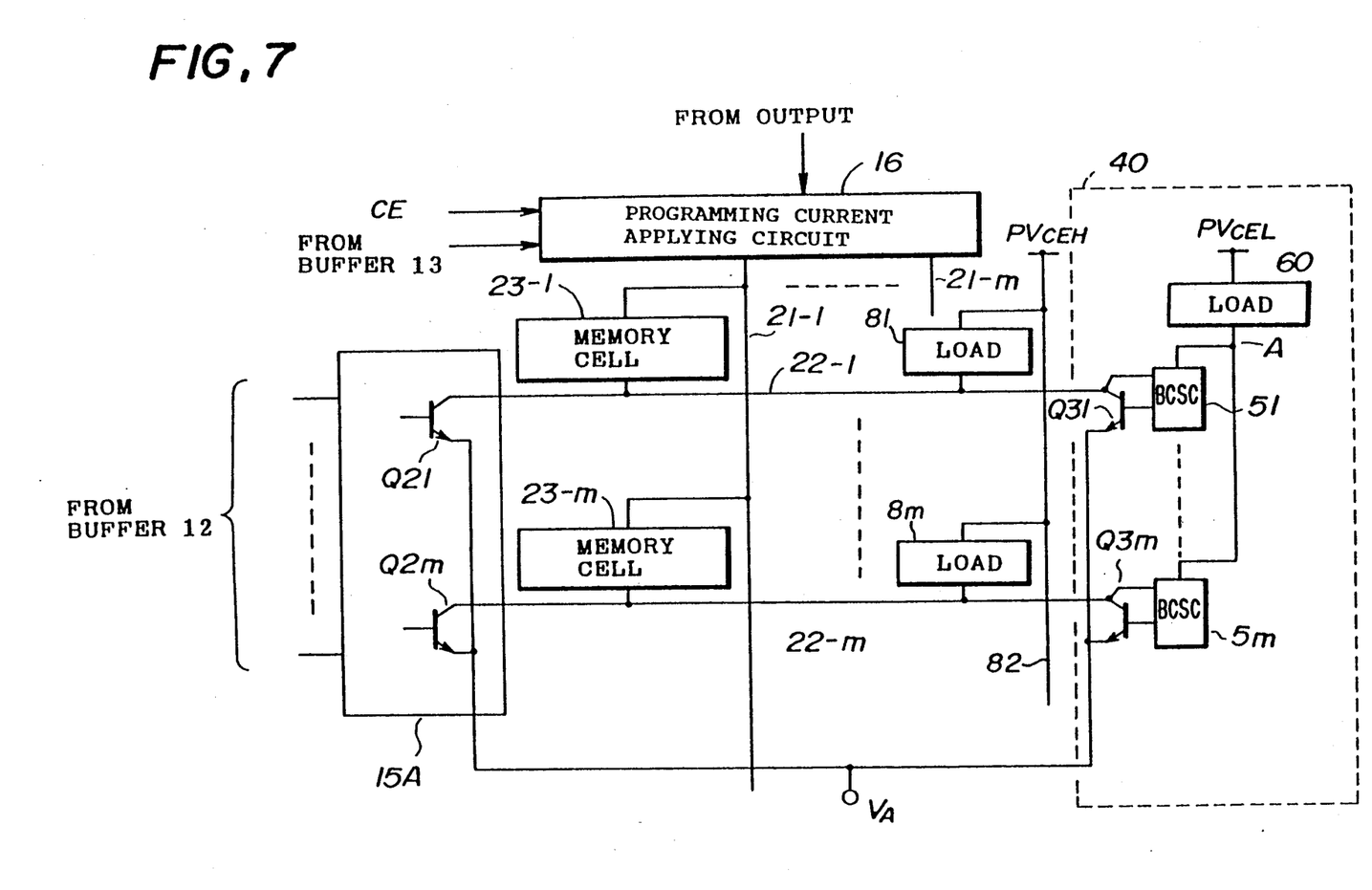
FIG. 7 is a block diagram of a second preferred embodiment of the present invention.

FIG. 7 is a circuit diagram of a second preferred embodiment of the present invention. In FIG. 7, those parts which are the same as those shown in the previously described figures are given the same reference numerals. The second embodiment of the present invention is configured by adding load elements 81-8m and a control line 82. The load elements 81-8m are connected to the control line 82 and the word lines 22-1 through 22-m, respectively. A programming voltage $PV_{CEH}$ is externally applied to the control line 82. It is preferable that $PV_{CEH}$ be larger than a programming voltage $PV_{CEL}$ which is applied to the common load element 60. During the programming operation, the programming voltage $PV_{CEH}$ is applied to the load elements 81 through 8m. The potential of the selected word line decreases to the volta $V_A$, at node A while the nonselected word lines are pulled to a high potential by the programming voltage $PV_{CEH}$ in the state where the potential of the node A is much lower than the programming voltage $PV_{CEL}$. Thus, it becomes more difficult for the transistor Q6 (FIGS. 5A and 5B) or Q9 (FIGS. 6A through 6D) to turn ON due to the occurrence of a noise.

Figure 8:
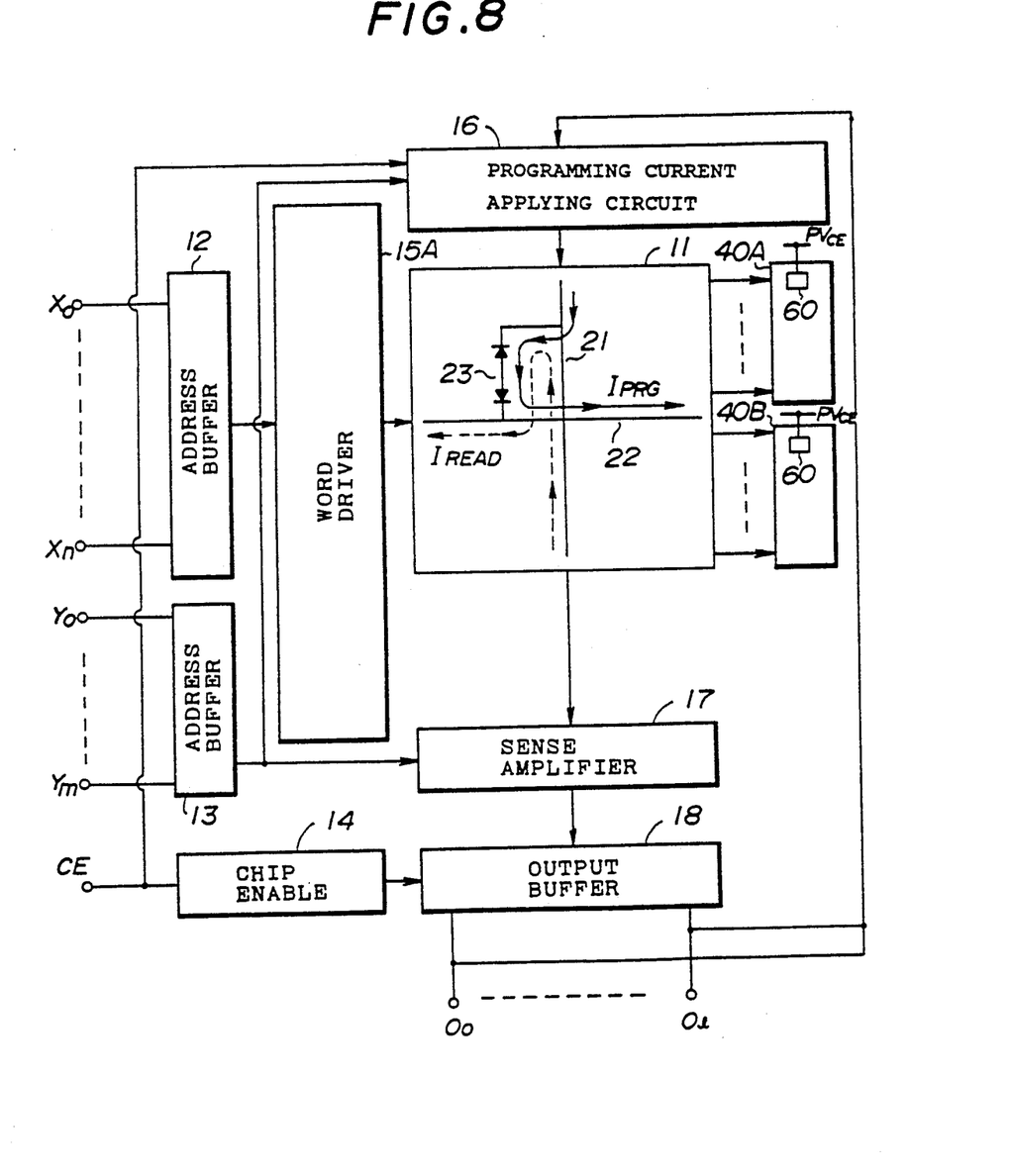
FIG. 8 is a block diagram of a third preferred embodiment of the present invention.

FIG. 8 is a block diagram of a third preferred embodiment of the present invention. In FIG. 8, those parts which are the same as those shown in the previously described figures are given the same reference numerals. As shown in FIG. 8, the programming current absorbing circuit 40 shown in FIG. 3 is divided into programming current absorbing circuits 40A and 40B. The programming current absorbing circuit 40A is provided for, for example, m/2 word lines, and the programming current absorbing circuit 40B is provided for the remaining m/2 word lines. Each of the circuits 40A and 40B is configured in the same way as the circuit 40A. The circuit 40A can prevent the erroneous programming operation arising from a noise on one or more word lines connected to the circuit 40A. Similarly, the circuit 40B can prevent the erroneous programming operation arising from a noise on one or more word lines connected to the circuit 40B. It is possible to divide the circuit 40 shown in FIG. 3 into three or more circuits. It will be noted the programming is less liable to be affected by noise as the circuit 40 is divided into an increased number of groups.

Figure 9A:
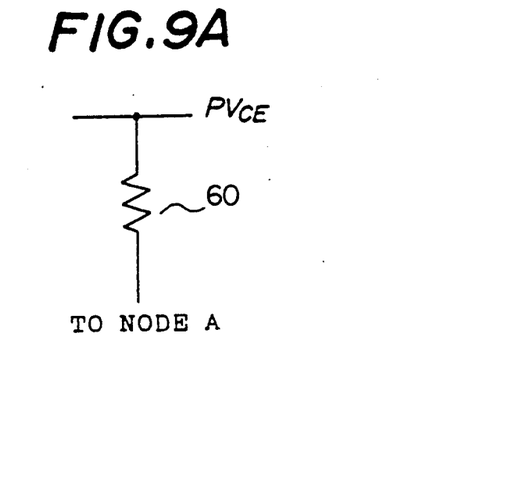
FIG. 9A, 9B and 9C are respectively circuit diagrams of a common load element used in the present invention.
Figure 9B:
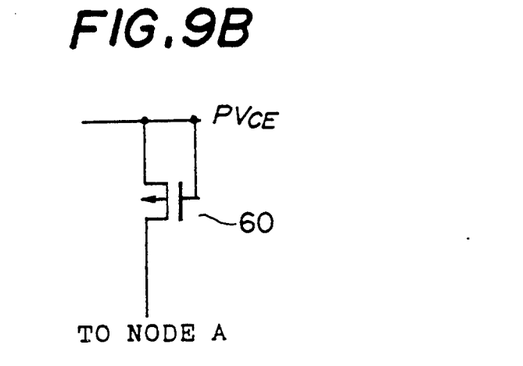
Figure 9C:
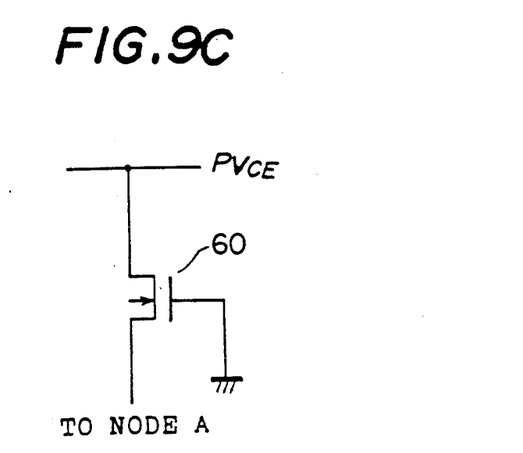

FIG. 9A shows the common load element 60. As shown, the common load element 60 is a resistor. As shown in FIG. 9B, the common load element 60 can be a P-channel field effect transistor having a source connected to the $PV_{CE}$ line, a drain connected to the node A, and a grounded connected to the $PV_{CE}$ line. Further, as shown in FIG. 9C, the common load element 60 can be formed of an N-channel field effect transistor having a drain connected to the $PV_{CE}$ line, a source connected to the node A, and a grounded gate.

The present invention is not limited to the specifically disclosed embodiments, and variations and modifications may be made without departing from the scope of the present invention.

What is claimed is:

1. A programmable memory device having word lines and bits lines defining cross points therebetween, comprising:

memory cells arranged at corresponding cross points of the word lines and the bit lines;

select means, coupled to said word lines, for selectively decreasing potentials of said word lines;

write means, coupled to said bit lines, for selectively supplying programming currents to said memory cells via the bit lines;

programming current absorbing transistors having corresponding first terminals connected to respectively associated said word lines, second terminals set at a predetermined potential, and bases;

a common load element connected between a node and a programming voltage line; and a plurality of base current supplying means, respectively coupled to said programming current, absorbing transistors and connected in common to said node, for turning ON said programming current absorbing transistors respectively associated with word lines selected by said select means so that base currents pass from said programming voltage line to the corresponding bases of said respectively associated programming current absorbing transistors via said common load element and said base current supplying means.

2. A programmable memory device as claimed in claim 1, wherein each of said base current supplying means comprises:

a bipolar transistor having an emitter coupled to said node, a collector coupled to the base of a corresponding one of the programming current absorbing transistors, and a base coupled to a corresponding one of the word lines and the first terminal of said corresponding one of the programming current absorbing transistors; and a resistance element having a first end connected to the collector of said bipolar transistor and a second end set at said predetermined potential.

3. A programmable memory device as claimed in claim 1, wherein each of said base current supplying means comprises:

a first bipolar transistor having an emitter coupled to said node, a base, and a collector;

a first resistance element connected between the base of said first bipolar transistor and a corresponding one of said word lines;

a second bipolar transistor having a collector coupled to said node, a base coupled to the collector of said first bipolar transistor, and an emitter coupled to the base of a corresponding one of the programming current absorbing transistors; and a second resistance element having a first end connected to the emitter of said second bipolar transistor and a second end set at said predetermined potential.

4. A programmable memory device as claimed in claim 3, wherein:

said first bipolar transistor is a PNP bipolar transistor; and said second bipolar transistor is an NPN bipolar transistor.

5. A programmable memory device as claimed in claim 1, wherein each of said base current supplying means comprises:
- a field effect transistor having a first terminal coupled to said node, a second terminal coupled to the base of a corresponding one of the programming current absorbing transistors, and a gate coupled to a corresponding one of said word lines; and
- a resistance element having a first end coupled to the base of said corresponding one of the programming current absorbing transistors and a second end set at said predetermined potential.

6. A programmable memory device as claimed in claim 1, wherein each of said base current supplying means comprises:
- a first field effect transistor having a first terminal coupled to said node, a second terminal coupled to the base of a corresponding one of said programming current absorbing transistors, and a gate coupled to a corresponding one of the word lines; and
- a second field effect transistor having a first terminal coupled to the second terminal of said first field effect transistor, a second terminal set at said predetermined potential, and a gate coupled to the gate of said first field effect transistor.

7. A programmable memory device as claimed in claim 6, wherein:
- said first field effect transistor is a P-channel field effect transistor; and
- said second field effect transistor is an N-channel field effect transistor.

8. A programmable memory device as claimed in claim 1, wherein each of said base current supplying means comprises:
- a field effect transistor having a first terminal coupled to said node, a gate coupled to a corresponding one of said word lines, and a second terminal;
- a bipolar transistor having a first terminal coupled to said node, a second terminal coupled to a corresponding one of said programming current absorbing transistors, and a base coupled to the second terminal of said field effect transistor;
- a first resistance element connected between the base and the second terminal of said bipolar transistor; and
- a second resistance element having a first end coupled to the second terminal of said bipolar transistor, and a second end set at said predetermined potential.

9. A programmable memory device as claimed in claim 8, wherein:
- said field effect transistor is a P-channel field effect transistor; and
- said bipolar transistor is an NPN bipolar transistor.

10. A programmable memory device as claimed in claim 1, wherein each of said base current supplying means comprises:
- a first field effect transistor having a first terminal coupled to said node, a second terminal and a gate;
- a second field effect transistor having a first terminal coupled to the second terminal of said first field effect transistor, a second terminal coupled to the base of the respective said programming current absorbing transistor, and a gate coupled to a corresponding one of the word lines;
- a third field effect transistor having a first terminal coupled t the second terminal of said second field effect transistor, a second terminal set at said predetermined potential, and a gate coupled to the gate of said first field effect transistor; and
- a bipolar transistor having a first terminal coupled to said node, a second terminal coupled to the second terminal of said second field effect transistor, and a base coupled to the second terminal of said first field effect transistor.

11. A programmable memory device as claimed in claim 10, wherein:
- said first field effect transistor is a P-channel field effect transistor;
- said second and third field effect transistors are N-channel field effect transistors; and
- said bipolar transistor is an NPN bipolar transistor.

12. A programmable memory device as claimed in claim 1, further comprising word line pull-up load elements, each having a first end set at a pull-up potential and a second end coupled to a corresponding one of said word lines.

13. A programmable memory device as claimed in claim 12, wherein said pull-up potential is higher than a programming voltage of said programming voltage line.

14. A programming memory device as claimed in claim 1, wherein said common load element comprises a resistor.

15. A programmable memory device as claimed in claim 1, wherein said common load element comprises a field effect transistor having a first terminal coupled to said node, a second terminal coupled to said programming voltage line, and a gate set at a predetermined gate voltage.

16. A programmable memory device as claimed in claim 1, further comprising output means for outputting data on said bit lines to an external device.

17. A programmable memory device having word lines and bits lines defining cross points therebetween, comprising:
- memory cells arranged at corresponding cross points of the word lines and the bit lines;
- select means, coupled to said word lines, for selectively decreasing potentials of said word lines, said word lines being grouped into a plurality of groups;
- write means, coupled to said bit lines, for selectively supplying programming currents to said memory cells via the bit lines;
- programming current absorbing transistors having corresponding first terminals connected to respective said word lines, second terminals set at a predetermined potential, and bases;
- a plurality of common load elements respectively provided with respect to said groups and connected between a programming voltage line and respective nodes; and
- a plurality of base current supplying means, respectively coupled to said programming current absorbing transistors and connected in common to said respective nodes, for turning ON said programming current absorbing transistors respectively associated with word lines selected by said select means so that base currents pass from said programming voltage line to the corresponding bases of said respectively associated programming current absorbing transistors via said common load element and said base current supplying means.

* * * * *

UNITED STATES PATENT AND TRADEMARK OFFICE
CERTIFICATE OF CORRECTION

PATENT NO. : 5,268,864
DATED : Dec. 7, 1993
INVENTOR(S) : FUJITA et al.

It is certified that error appears in the above-indentified patent and that said Letters Patent is hereby corrected as shown below:

FRONT PAGE:
   [75] Inventors: Line 2, change "Inagi" to --Tokyo--;
   [56] References Cited, under "OTHER PUBLICATIONS", first reference, line 2, change "JP-A-029998" to --JP-A-2 029998--.

Col. 1, line 27, after "comprising" delete "of".

Col. 2, line 23, after "comprises" delete "of".

Col. 4, line 11, before "NPN" delete "of";
line 25, after "node A" insert --at--.

Col. 7, line 29, change "volta" to --voltage--; after "$V_A$" delete ","; and after "node A" insert --,--;
line 68, after "gate" insert --shown in FIGS. 4 and 7--.

Col. 8, line 23, after "current" delete ",".

Col. 9, line 68, change "t" to --to--.

Signed and Sealed this

Second Day of August, 1994

Attest:

BRUCE LEHMAN

*Attesting Officer*  *Commissioner of Patents and Trademarks*